United States Patent
Klazynski et al.

(10) Patent No.: US 10,831,626 B2
(45) Date of Patent: Nov. 10, 2020

(54) METHOD TO SORT PARTIALLY GOOD CORES FOR SPECIFIC OPERATING SYSTEM USAGE

(71) Applicant: International Business Machines Corporation, Armonk, NY (US)

(72) Inventors: James N. Klazynski, Austin, TX (US); Douglas L. Lehr, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 15/787,938

(22) Filed: Oct. 19, 2017

(65) Prior Publication Data

US 2019/0121713 A1   Apr. 25, 2019

(51) Int. Cl.
*G06F 11/00* (2006.01)
*G06F 11/22* (2006.01)
*G01R 31/3185* (2006.01)
*G01R 31/317* (2006.01)

(52) U.S. Cl.
CPC .... *G06F 11/2242* (2013.01); *G01R 31/31707* (2013.01); *G01R 31/318536* (2013.01)

(58) Field of Classification Search
CPC .................................................. G06F 11/2242
See application file for complete search history.

(56) References Cited

U.S. PATENT DOCUMENTS

| | | | |
|---|---|---|---|
| 5,644,742 A * | 7/1997 | Shen | G06F 9/3004 712/244 |
| 7,353,440 B2 | 4/2008 | Ohwada et al. | |
| 7,360,134 B1 * | 4/2008 | Jacobson | G01R 31/3187 714/30 |
| 7,484,153 B2 | 1/2009 | Kiryu et al. | |
| 9,311,202 B2 | 4/2016 | Wang et al. | |
| 9,448,282 B1 * | 9/2016 | Meehl | G01R 31/31833 |
| 9,612,929 B1 * | 4/2017 | Dusanapudi | G06F 11/263 |
| 2005/0240850 A1 * | 10/2005 | Ohwada | G01R 31/31854 714/738 |
| 2012/0044948 A1 | 2/2012 | Nachum et al. | |
| 2012/0054560 A1 * | 3/2012 | Adir | G06F 11/3664 714/54 |

(Continued)

OTHER PUBLICATIONS

Powell et al. (2009). Architectural core salvaging in a multi-core processor for hard-error tolerance. Proceedings of the 36th annual international symposium on Computer architecture, 37(3), 93-104.

(Continued)

*Primary Examiner* — Katherine Lin
(74) *Attorney, Agent, or Firm* — Patterson + Sheridan, LLP

(57) ABSTRACT

A method for testing a multi-core integrated circuit device including a plurality of processing cores includes testing a first processing core on the integrated circuit device utilizing one or more tests. If a first feature on the first processing core fails a first test, the method includes performing a second test on the first processing core that tests the first processing core without the first feature. The method includes determining, based on the second test, if the first processing core is operable without the first feature. If the first processing core is operable without the first feature, the method includes storing information about the first processing core's capabilities in vital product data.

18 Claims, 3 Drawing Sheets

(56) References Cited

U.S. PATENT DOCUMENTS

2013/0159799 A1   6/2013  Brown et al.
2015/0106822 A1   4/2015  Lei
2016/0203023 A1*  7/2016  Mitran .................. G06F 9/5011
                                                                 718/104

OTHER PUBLICATIONS

IBM (2009). Method to salvage processors that fails power acceptance tests. IP.COM Prior Art DTD.

* cited by examiner

METHOD TO SORT PARTIALLY GOOD CORES FOR SPECIFIC OPERATING SYSTEM USAGE

BACKGROUND

The present invention relates to processor testing, and more specifically, to determining partially good processor cores for specific functions.

During processor manufacturing, hundreds of tests are executed to assess the functional performance of a processor. In order to improve yield, multi-core modules sometimes have redundant processing cores. If one processing core fails testing, that failed core can be disabled and the processor salvaged, or the chip can be shipped out as a lower core part. In addition, a chip may be shipped at a lower frequency due to any number of underperforming cores. However, this wastes modules and also drives up the cost of manufacturing, as more wafers are needed to achieve module quotas.

SUMMARY

According to one embodiment of the present disclosure, a method for testing a multi-core integrated circuit device including a plurality of processing cores includes testing a first processing core on the integrated circuit device utilizing one or more tests. If a first feature on the first processing core fails a first test, the method includes performing a second test on the first processing core that tests the first processing core without the first feature. The method includes determining, based on the second test, if the first processing core is operable without the first feature. If the first processing core is operable without the first feature, the method includes storing information about the first processing core's capabilities in vital product data.

According to another embodiment of the present disclosure, a computer program product for testing a multi-core integrated circuit device including a plurality of processing cores includes a computer-readable medium program having program instructions embodied therewith, the program instructions executable by a processor to perform an operation that includes testing a first processing core on the integrated circuit device utilizing one or more tests. The operation further includes, if a first feature on the first processing core fails a first test, performing a second test on the first processing core that tests the first processing core without the first feature. The operation also includes determining, based on the second test, if the first processing core is operable without the first feature. If the first processing core is operable without the first feature, the operation includes storing information about the first processing core's capabilities in vital product data.

According to another embodiment of the present disclosure, a system includes a processor and a memory storing a program, which, when executed on the processor, performs an operation for testing a multi-core integrated circuit device including a plurality of processing cores. The operation includes testing a first processing core on the integrated circuit device utilizing one or more tests. If a first feature on the first processing core fails a first test, the operation includes performing a second test on the first processing core that tests the first processing core without the first feature. The operation includes determining, based on the second test, if the first processing core is operable without the first feature. If the first processing core is operable without the first feature, the operation includes storing information about the first processing core's capabilities in vital product data.

DETAILED DESCRIPTION

Embodiments herein describe methods to alleviate waste caused by processing cores that fail during manufacturing and testing. Depending on what area of a particular core failed, certain processor functions may be unavailable. If one of these processor functions is not required for a given software application, the disabled core may be sufficient for that software application. One of the fully functional cores could be used for a different, more general purpose operation. Information about which functions are available on which cores can be saved in vital product data (VPD) and communicated to an operating system (OS) to exploit that knowledge. The operating system can then use the appropriate cores for specific functions.

A multi-core processor integrated circuit device or chip consistent with the disclosure includes a plurality of processing cores that are functional duplicates of one another such that, in response to the same input being input to the scan chains of the processing cores, as well as the processing cores being clocked the same number of clock cycles, the test results output by the scan chains of the processing cores are identical in the absence of a fault in any of the processing cores. A processing core typically includes a plurality of functional units, including, for example, an issue unit, a fixed point execution unit, a floating point execution unit or other auxiliary execution unit or accelerator, one or more levels of on-board cache such as an L1 and/or L2 cache, etc., although it will be appreciated that practically any circuit logic that is disposed within a processing core can be considered a functional unit for the purposes of the disclosure.

Figure 1:
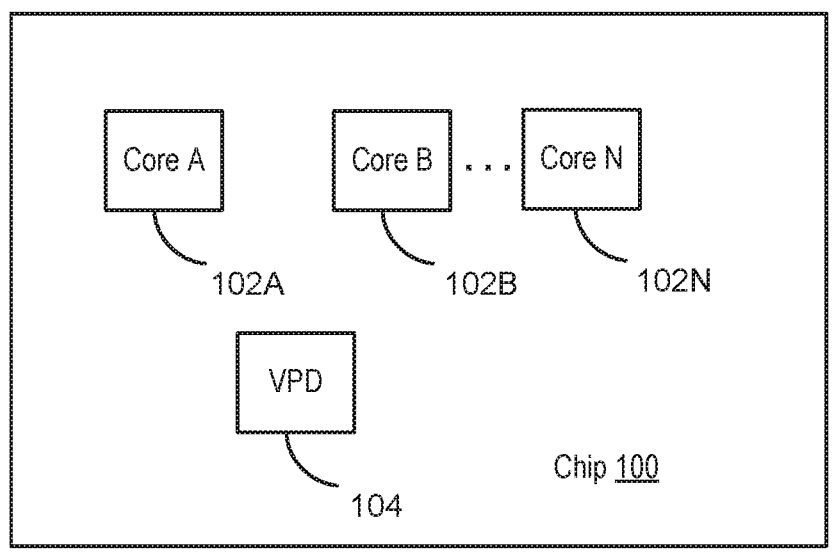
FIG. 1 is a block diagram of a chip according to an embodiment.

FIG. 1 illustrates an example of a chip 100 according to one embodiment. Chip 100 is a simplified block diagram with many components not illustrated, such as memory, controllers, or interfaces. Chip 100 shown here comprises multiple processing cores 102. Chip 100 can comprise any number of cores, such as Core A 102A, Core B 102B, etc., up to Core N 102N. Chip 100 also comprises VPD 104, where information about the chip can be stored in non-volatile memory. This information can include data about the functionality of the cores 102 on the chip 100 according to embodiments herein.

Each of the cores 102 are tested with hundreds of tests during manufacturing of the chop. In one example embodiment, a chip 100 has 12 processing cores 102. The 12 cores 102 are each tested to assess the functional performance of the chip. If, for example, four of the cores partially fail, the functionality remaining for each of those four cores may be stored in VPD 104. That is, information about which parts or features of those four cores are fully or partially functional is stored in VDP 104. Then, chip 100 could be utilized as a chip with eight good cores and four partially good cores. In existing systems, the four partially good cores would be completely disabled and the chip 100 would be shipped to a user and used as an 8-core chip. In embodiments described herein, however, the chip 100 could be used as an 8-core chip with some amount of additional functionality provided by the four partially good cores. That is, the chip would have more functionality than a typical 8-core chip. Embodiments describes below illustrate examples of cores that have reduced functionality but that may still be used for certain operations.

Figure 2:
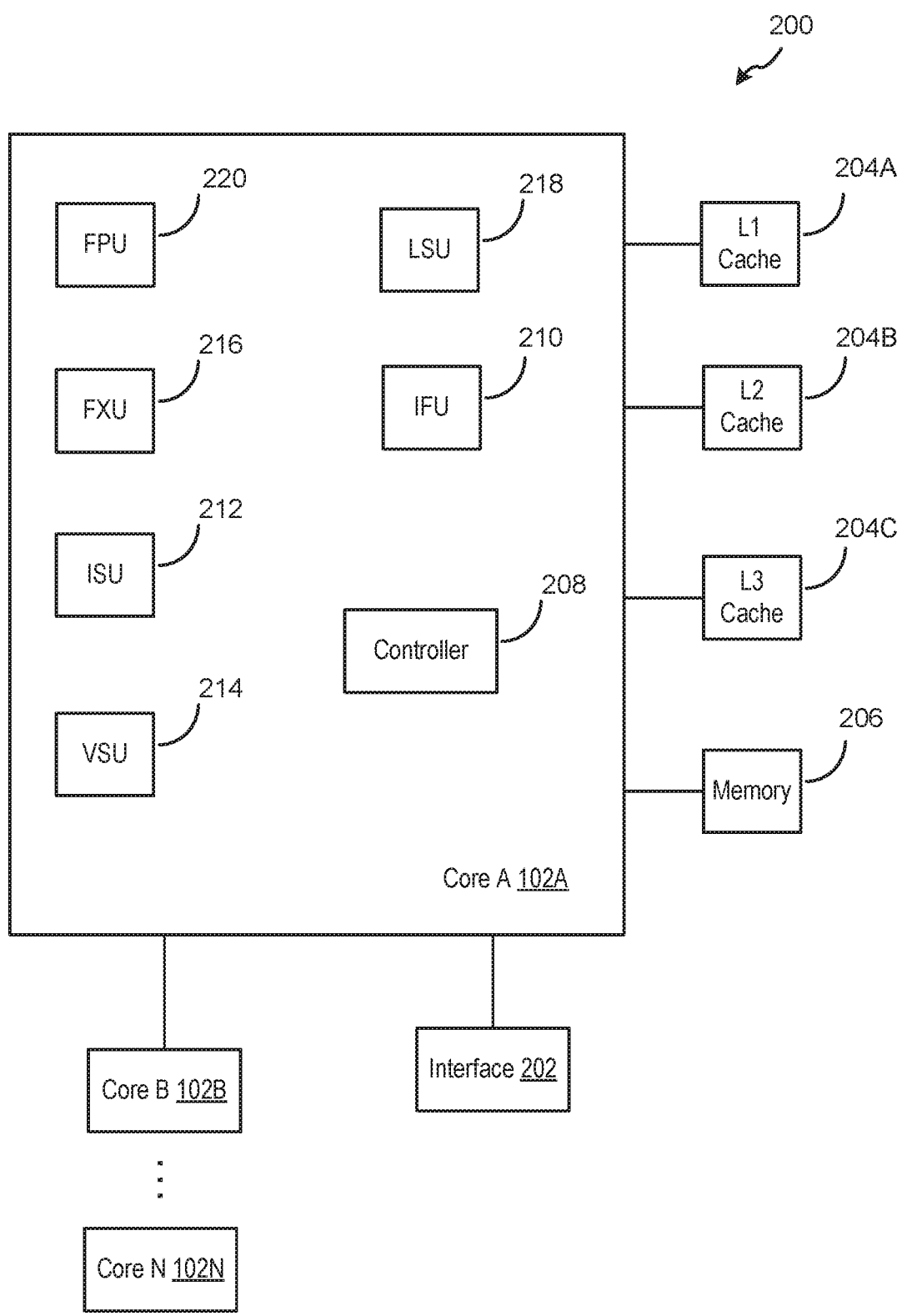
FIG. 2 is a block diagram of a chip that includes multiple processing cores according to an embodiment.

FIG. 2 illustrates an example system 200 that comprises N processing cores 102 on a processing chip 100. Selected details of core A 102A are illustrated in FIG. 2. Core B 102B and the rest of the N cores 102 are similar to core A 102A but the details have been omitted from the figure for simplicity.

Core A 102A may be coupled to one or more interfaces 202 that are used to communicate with one or more components on chip 100 or off of chip 100. Core A may also be coupled to memory 206. Memory 206 may comprise a random access memory (RAM), a read-only memory (ROM), an erasable programmable read-only memory (EPROM or Flash memory), an optical storage device, a magnetic storage device, or any suitable combination of the foregoing. Memory 206 is operable to store data that may be retrieved for computing operations. Memory 206 may also comprise memory that is on chip 100 and/or within a core 102, such as core A 102A.

Core A 102A further comprises one or more caches 204. In this example, core A 102A has three caches: L1 cache 204A, L2 cache 204B, and L3 cache 204C. Each of the caches may be located either on core A 102A or off core A 102A, and could also be located off chip 100 in some embodiments. In embodiments described herein, the caches 204 can be disabled independently depending on the results of the tests conducted on chip 100.

Core A 102A may comprise one or more controllers 208 that perform certain operations for chip 100. Controllers 208 may run firmware or software perform to various tasks for computer system 100.

Core A 102A may comprise an instruction fetch unit (IFU) 210. IFU 210 may contain, among other things, an instruction fetch address register (IFAR), which stores the address for the next instruction fetch. IFU 210 may also comprise an instruction cache that can store a plurality of instructions. IFU 210 may comprise instruction buffers that are used to buffer instructions or groups of instructions from the instruction cache. In addition, a thread select can select threads from the instruction buffer.

Instruction sequencing unit (ISU) 212 issues instructions to various units for execution, such as the vector-scalar unit (VSU) 214, the fixed point unit (FXU) 216, the load-store unit (LSU) 218, or the floating point unit (FPU) 220.

VSU 214 is responsible for execution of vector instructions and floating point instructions. FXU 216 handles fixed-point arithmetic instructions and can perform other fixed point operations. The LSU 218 executes load and store instructions and can load data from memory or store it back into memory. FPU 220 executes operations on floating-point numbers.

During manufacturing, the above components of FIG. 2 may be tested with a number of tests to determine the extent of the functionality of each component. Then, if certain functionality is disabled, that information is stored in VPD 104 (illustrated in FIG. 1) for use by an operating system or application in determining how the chip 100 will perform operations. For example, caches 204 are a common point of failure when chips are tested. A processing core 102 may be slowed considerably when one or more of the caches 204 fails. In embodiments herein, one or more failed caches will not necessarily disable the entire core 102. Instead, the failure information is stored in VPD 104. If L1 cache 204A fails testing but the other caches pass the testing, that information is stored in VDP 104 and an operating system can assign operations to this specific processing core that does not require the full use of all the caches in the core. For example, if an operation is not latency sensitive, a core with less cache may be used without a significant decline in performance. Partially functional cores that do not have a fully functional cache (because one, two, or even all of the caches fail a test) can therefore be used for certain operations instead of the entire core being disabled. In other embodiments, parts of a cache may fail and that information may be stored in VPD 104 for use by an OS or application.

As another example, an FPU 220 or VSU 214 on a processing core 102 may fail a test during manufacturing and testing. These features may be disabled and that information stored in VPD 104 so that the processing core 102 can be used with reduced functionality instead of disabling the entire core 102. That is, the operating system may assign an application that does not require a floating point unit (such as FPU 220) or a vector-scalar unit (such as VSU 214) to be run on a core 102 where those specific units have been disabled. The other fully functional cores 102 on the chip 100 may be used by the operating system for applications that require the full functionality of a core 102 on chip 100.

In embodiments herein, any suitable tests may be used to test the functions of the processing cores 102. Some tests check for scenarios that should never occur, known as checkers. A properly performing processing core should always produce the same result for the same operation even after a large number of cycles, such as billions of cycles. If an incorrect result occurs, a checker is asserted. If any of the checkers are ever asserted, the logic has reached a result that is not intended. Checkers such as these provide one method for determining which part of the processing core's logic is not operating as designed. So, for example, if a floating point overflow checker fires, the failure is most likely in the FPU 220. If a checker fires on a vector operation, the failure is most likely in the VSU 214. Because the expected results of the tests are known before the tests are conducted, the failing component or feature can be determined and that information stored in VPD 104. These types of tests can thus be used by embodiments herein to determine the functionality of specific components on a core 102.

Certain structural tests can also be performed on processing chip 100. One example is a logic built-in self-test (LBIST). An LBIST is a test in which hardware or software is built into an integrated circuit that tests the operation of the circuit. A related type of test is an array built-in self-test (ABIST). The ABIST is a test that is optimized for testing arrays. Thus, certain logic and arrays may utilize these method to test themselves. These tests can be run and the results compared to an expected outcome. If the expected outcome is not achieved, the structure that was tested (i.e., the logic or array) may be bad. Information about the faulty structure can be stored in VPD 104 and the operating system or application can utilize the partially functional processing core 102 accordingly. That is, applications that can successfully complete on the partially functionally processing core 102 without that functionality may be assigned to the partially functional processing core 102 by the operating system.

In another embodiment, a processing core may be used by an application to offload work to an accelerator, such as a graphics processing unit (GPU), or to another component. If the processing core is performing these operations, the processing core is mostly moving data back and forth between itself and the other component. The processing core therefore does not need the full functionality of a properly functioning processing core. A core that has failed certain tests may still be suitable for these types of operations.

In yet another embodiment, a chip 100 may use different resources in a processing core 102 depending on how many hardware threads are running in the core 102. If a processing core has failed one or more tests and has reduced functionality, one restriction may be to limit how many threads can be started on that specific core 102. For example, the VPD 104 can notify the OS that only a specific number of threads may be started on that core. Applications that require threads below the limit may be performed by the partially functional processing core 102. Applications that require more functionality can be assigned to fully functional cores by the OS.

In yet another embodiment, logic on the processing core 102 may be used to disable a component of the processing core 102. For example, a processing core such as processing core 102 may have a number of registers on the core 102. If one or more of these registers fails a test, those registers that failed may be disabled and the operating system or applications can work around those registers. Applications running on the core can be restricted to only using the functional registers on the processing core 102.

Another feature of processing core 102 may be a branch history table in some embodiments. The branch history table records past actions and targets for branches, and predicts whether future behavior will repeat. If a test is performed and a branch history table is found to have a faulty array in it, the branch history table feature can be disabled on that core and this information can be recorded in VPD 104. A processing core 102 may experience reduced performance without a branch history table, but the processing core 102 could still be functional for certain applications. The operating system could read VPD 104 to determine whether this feature is available for a specific processing core 102. The OS could then assign appropriate operations to the processing cores 102 depending on whether a branch history table is needed or not.

Figure 3:
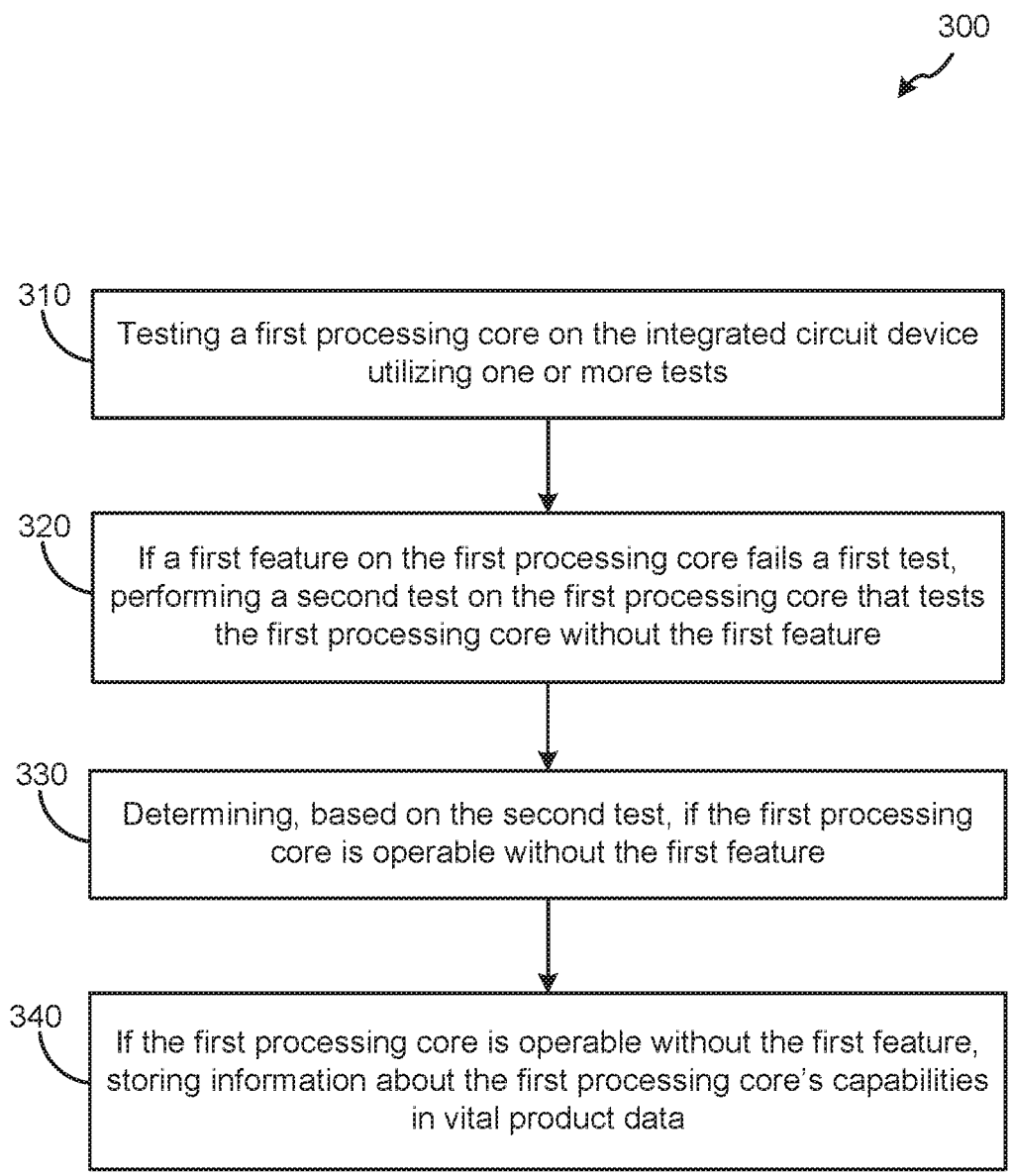
FIG. 3 is a flowchart illustrating an exemplary method of testing an integrated circuit device according to an embodiment.

FIG. 3 illustrates a flowchart of a method 300 for testing a multi-core integrated circuit device. Although the method steps are described in conjunction with the systems of FIGS. 1-2, persons skilled in the art will understand that any system configured to perform the method steps, in any order, falls within the scope of the present invention. In various embodiments, the hardware and/or software elements described above in FIGS. 1-2 can be configured to perform the method steps of FIG. 3.

The method 300 begins with step 310, where a first processing core on an integrated circuit device is tested utilizing one or more tests. As described above, hundreds of tests may be performed on a processing core to test the various features and capabilities of the processing core. Each processing core on a chip or device may undergo an identical series of tests.

The method proceeds to step 320. At step 320, if a first feature on the first processing core fails a first test, a testing executor performs a second test on the first processing core that tests the first processing core without the first feature. For example, if a cache memory on the processing core fails the first test, a second test is performed without that feature. Through this extra test, the testing executor can determine if the processing core can be salvaged and operated with a less-than-complete set of features. The testing executor can determine, for example, which of the caches failed and whether the processing core is still functional without the failing cache. Any number of additional tests can be performed to determine the capabilities and features of the processing core.

At step 330, the testing executor determines, based on the second test or other additional tests, if the first processing core is operable without the first feature. Here, the testing executor reviews the results of tests to determine the extent of the failing features and how much capability the first processing core is left with. The method then proceeds to step 340.

At step 340, if the first processing core is operable without the first feature, the testing executor stores information about the first processing core's capabilities in vital product data. This information can then be read by the operating system to determine how this partially functional core can be utilized. Thus, a processing core that fails a test does not have to be completely disabled on the integrated circuit device. Instead, the partially functional core can be utilized for specific operations or applications that the core is capable of performing with its reduced functionality.

As described above, if regions or features of a processing core are identified and testable, embodiments herein can disable certain regions and utilize a processing core with reduced functionality based on the results of those tests. Example features that can be tested and disabled include the FPU, VSU, or memory caches. When a processing core fails a test, a text executor determines which part of the processing core failed. The testing executor can then individually test the core components to determine how operational the rest of the core is without the failing features. The capabilities of these partially good cores are communicated to the operating system by writing this information in VPD. An operating system, application, or compiler can specify which parts of a processing core are needed to perform a specific function, and which parts are unused for that function. Then, during process scheduling, the operating system can view the application's needs and determine if this particular application can be run on one of the "partially good" cores, or if instead a processing core is needed that has full functionality.

Advantageously, a chip with multiple processing cores can be tested and the processing cores can be tested for individual features. If a certain feature fails, the processing core can still be "passed" as a processing core with limited functionality. Information about the features of the processing core that are unavailable can be stored in vital product data in some embodiments. An operating system, application, or compiler can then use this stored information to determine which functions can be performed on which processing cores on the processing chip.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method of testing a multi-core integrated circuit device including a plurality of processing cores, the method comprising:
    testing a first feature and a second feature in a first processing core on the integrated circuit device utilizing one or more tests, wherein the first feature comprises a portion of cache memory;
    upon determining that the portion of cache memory on the first processing core fails a first test, performing a second test on the first processing core that tests the first processing core without the portion of cache memory;
    determining, based on the second test, if the first processing core is operable without the portion of cache memory; and
    upon determining that the first processing core is operable without the portion of cache memory, storing information about the first processing core's capabilities in vital product data.

2. The method of claim 1, further comprising:
    reading the information about the first processing core's capabilities stored in vital product data; and
    executing an application with the first processing core that utilizes the first processing core's capabilities.

3. The method of claim 1, wherein the second feature on the first processing core comprises a number of hardware threads running in the first processing core.

4. The method of claim 1, wherein the second feature on the first processing core is a floating point unit.

5. The method of claim 1, wherein the second feature on the first processing core is a vector unit.

6. The method of claim 1, wherein the second feature on the first processing core comprises a branch history table.

7. A computer program product for testing a multi-core integrated circuit device including a plurality of processing cores, the computer program product comprising a computer-readable storage medium program having program instructions embodied therewith, the program instructions executable by a processor to perform an operation comprising:
    testing a first feature and a second feature in a first processing core on the integrated circuit device utilizing one or more tests, wherein the first feature comprises a a portion of cache memory;
    upon determining that the portion of cache memory on the first processing core fails a first test, performing a second test on the first processing core that tests the first processing core without the portion of cache memory;
    determining, based on the second test, if the first processing core is operable without the portion of cache memory; and
    upon determining that the first processing core is operable without the portion of cache memory, storing information about the first processing core's capabilities in vital product data.

8. The computer program product of claim 7, the operation further comprising:
    reading the information about the first processing core's capabilities stored in vital product data; and
    executing an application with the first processing core that utilizes the first processing core's capabilities.

9. The computer program product of claim 7, wherein the second feature on the first processing core comprises a number of hardware threads running in the first processing core.

10. The computer program product of claim 7, wherein the second feature on the first processing core is a floating point unit.

11. The computer program product of claim 7, wherein the second feature on the first processing core is a vector unit.

12. The computer program product of claim 7, wherein the second feature on the first processing core comprises a branch history table.

13. A system, comprising:
    a processor; and
    a memory storing a program, which, when executed on the processor, performs an operation for testing a multi-core integrated circuit device including a plurality of processing cores, the operation comprising:
    testing a first feature and a second feature in a first processing core on the integrated circuit device utilizing one or more tests, wherein the first feature comprises a portion of cache memory;
    upon determining that the portion of cache memory on the first processing core fails a first test, performing a second test on the first processing core that tests the first processing core without the portion of cache memory;
    determining, based on the second test, if the first processing core is operable without the portion of cache memory; and
    upon determining that the first processing core is operable without the portion of cache memory, storing information about the first processing core's capabilities in vital product data.

14. The system of claim 13, the operation further comprising:
    reading the information about the first processing core's capabilities stored in vital product data; and
    executing an application with the first processing core that utilizes the first processing core's capabilities.

15. The system of claim 13, wherein the second feature on the first processing core comprises a number of hardware threads running in the first processing core.

16. The system of claim 13, wherein the second feature on the first processing core is a floating point unit.

17. The system of claim 13, wherein the second feature on the first processing core comprises a branch history table.

18. The system of claim 13, wherein the second feature on the first processing core is a vector unit.

* * * * *